(12) United States Patent
Yune et al.

(10) Patent No.: US 8,181,127 B2
(45) Date of Patent: May 15, 2012

(54) STANDARDIZATION OF ASSIST PATTERN INSERTED INTO OUTERMOST PATTERN FOR ENHANCING DEPTH OF FOCUS MARGIN

(75) Inventors: Hyoung Soon Yune, Seoul (KR); Joo Kyoung Song, Gyeonggi-do (KR); Hak Yong Sim, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 245 days.

(21) Appl. No.: 12/647,614

(22) Filed: Dec. 28, 2009

(65) Prior Publication Data
US 2010/0333046 A1  Dec. 30, 2010

(30) Foreign Application Priority Data
Jun. 29, 2009 (KR) ................ 10-2009-0058535

(51) Int. Cl.
*G06F 17/50* (2006.01)
(52) U.S. Cl. ................ 716/53; 716/51; 430/5
(58) Field of Classification Search ............ 716/51, 716/53; 430/5
See application file for complete search history.

(56) References Cited

U.S. PATENT DOCUMENTS

| | | | |
|---|---|---|---|
| 5,538,815 A * | 7/1996 | Oi et al. | 430/5 |
| 5,543,252 A * | 8/1996 | Shibata et al. | 430/5 |
| 5,895,741 A * | 4/1999 | Hasegawa et al. | 430/5 |
| 6,780,574 B2 * | 8/2004 | Kawashima | 430/394 |
| 6,940,585 B2 * | 9/2005 | Nomura et al. | 355/55 |
| 7,147,975 B2 * | 12/2006 | Misaka | 430/5 |
| 7,547,502 B2 * | 6/2009 | Kawashima | 430/311 |
| 7,781,126 B2 * | 8/2010 | Yen | 430/5 |
| 2003/0152873 A1 * | 8/2003 | Tainaka et al. | 430/313 |
| 2006/0263700 A1 * | 11/2006 | Sub Nam | 430/5 |
| 2007/0054197 A1 * | 3/2007 | Yen | 430/5 |
| 2010/0081068 A1 * | 4/2010 | Kim | 430/5 |
| 2010/0316940 A1 * | 12/2010 | Yang et al. | 430/5 |

FOREIGN PATENT DOCUMENTS

| | | |
|---|---|---|
| JP | 2007-240949 A | 9/2007 |
| KR | 1020040075785 A | 8/2004 |
| KR | 1020070092549 A | 9/2007 |

* cited by examiner

*Primary Examiner* — Naum Levin
(74) *Attorney, Agent, or Firm* — Ladas & Parry LLP

(57) ABSTRACT

A method for processing optical proximity correction is disclosed which eliminates a need for repeated implementation of experiments and result in a reducing the processing time as compared to trial and error. Furthermore, the method can realize an optimal insertion of the assist pattern by applying different conditions to specific layers. The method includes determining whether or not to insert an assist pattern around an outermost pattern. A shape of the assist pattern inserted around the outermost pattern is determined. The contrast of the outermost pattern is compared against a contrast of a cell array pattern. The contrast of the outermost pattern is repeated compared with the contrast of the cell array pattern under a defocus state.

13 Claims, 4 Drawing Sheets

STANDARDIZATION OF ASSIST PATTERN INSERTED INTO OUTERMOST PATTERN FOR ENHANCING DEPTH OF FOCUS MARGIN

CROSS-REFERENCE TO RELATED APPLICATION

The priority of Korean patent application No. 10-2009-0058535 filed Jun. 29, 2009, the disclosure of which is hereby incorporated in its entirety by reference, is claimed.

BACKGROUND

The present invention relates to a method for processing optical proximity correction, and more particularly, to a method for processing optical proximity correction that uses standardization of an assist pattern which is to be inserted into an outermost pattern for the purpose of enhancing a Depth Of Focus (DOF) margin.

Generally, a semiconductor device is formed on a semiconductor substrate via a photo lithography process. In a conventional photo lithography process, after a photo-resist film is uniformly applied onto a semiconductor substrate. Afterwards the photo-resist film is subjected to an exposure process and subsequently developed to form the photo-resist film pattern which is used as a photo mask to layout the semiconductor device. As an etching object layer below the photo-resist film pattern is etched using the photo-resist film pattern as an etching mask, formation of a specific pattern into the semiconductor substrate is completed.

Such a photo lithography process is becoming increasingly important with an increase in the integration degree of a semiconductor device. This is because the greater the number of cells that should be formed in a limited area, the smaller the critical dimension of a pattern and consequently, the narrower the distance between neighboring patterns, which results in an optical proximity effect by the neighboring patterns. The optical proximity effect may cause distortion of light having passed through a photo mask, making it impossible for a wafer (i.e. the semiconductor substrate) to be exposed according to the layout formed on the photo mask and may result in distorting the desired formed pattern. Therefore, despite the fact that the neighboring patterns should be spaced apart from each other, the completely formed patterns may be connected to each other even though this is unwanted.

Because the optical proximity effect can cause unwanted distortions to the neighboring patterns as described above, then there is a need for technologies related to optical proximity correction. Examples of these technologies include an Optical Proximity Correction (OPC) technology for compensating for diffraction of light using a pattern, and a phase shift mask technology for improving a resolution via an increase in optical contrast. In addition, a chemically amplified resist, which exhibits an excellent photosensitivity with respect to light having a far-ultraviolet wavelength of 248 nm or 194 nm, may be used to achieve an enhanced resolution. There are also various other technologies including, e.g., formation of an assist pattern (as one kind of dummy pattern) that is separated from a main pattern and serves to control an optical proximity effect.

Meanwhile, in development of a semiconductor device, acquiring a sufficient margin when a pattern is formed is very important to substantially prevent a reduction in mass production yield due to defective semiconductor devices brought about by insufficient margins. In particular, as a pattern size is reduced with an increase in the integration degree of a semiconductor device, acquisition of a margin is being emphasized. Here, the term "margin" denotes a process margin with respect to a process for formation of a pattern of a semiconductor device. In more detail, a Depth Of Focus (DOF) margin with respect to an exposure process for formation of a pattern is closely related to a resolution and a critical dimension of a pattern and thus the DOF margin is a very important factor.

To improve a depth of focus, it is generally proposed to insert an assist pattern around an outermost pattern. In this case, rather than inserting the assist pattern around the outermost pattern according to a specific design rule, e.g., a basic shape of the assist pattern is first determined by an experienced engineer and the like and thereafter, assist patterns having superior estimation results are determined via repeated experiments, so as to be inserted into the outermost pattern.

As described above, since the process of inserting the assist pattern for the purpose of improving a depth of focus, i.e. for the purpose of processing optical proximity correction is accomplished via repeated experiments based on engineering know-how, there is a limit with relation to an increase in mask fabrication (S170) time and costs.

BRIEF SUMMARY OF THE INVENTION

Various embodiments of the present invention are directed to providing a method for processing optical proximity correction that substantially obviates one or more problems due to limitations and disadvantages of the related art. According to the related art, a process of inserting an assist pattern into an outermost pattern for the purpose of processing optical proximity correction requires excessive time and costs.

The method for processing optical proximity correction includes determining whether or not to insert an assist pattern around an outermost pattern, determining a shape of the assist pattern inserted around the outermost pattern, comparing a contrast of the outermost pattern with a contrast of a cell array pattern, and repeatedly comparing a contrast of the outermost pattern with a contrast of the cell array pattern under a defocus state. When the standardized assist pattern is inserted around the outermost pattern via the above described operations, the time and costs required to determine the assist pattern can be effectively reduced which results in efficient optical proximity correction of the outermost pattern.

The determination of whether to insert the assist pattern may include determining that optical proximity correction of the outermost pattern is completed when insertion of the assist pattern is unnecessary.

The determination of the shape of the assist pattern inserted around the outermost pattern may be differently accomplished in accordance to a shape of the outermost pattern.

The comparison of the contrast of the outermost pattern may include confirming whether or not the contrast of the outermost pattern is 90% or more than that of the contrast of the cell array pattern. In this case, a value of 90% or more of the contrast of the main cell pattern is thought to assure that the outermost pattern can be realized without serious distortion as compared to the main cell pattern. This is based on the assumption that a photo source used for realization of the outermost pattern is substantially free from an optical proximity effect and is under the same photo conditions as a photo source used for realization of the main cell pattern. By comparing the contrast of the outermost pattern with the contrast of the main cell pattern, the process costs and time can be reduced, as well as, reducing the inaccuracy caused when the shapes or positions of the assist patterns are estimated via engineering know-how or process know-how.

The comparison of the contrast of the outermost pattern may include determining the contrast of the outermost pattern under a best focus condition.

After the comparison of the contrast of the outermost pattern, the method may further include resetting the shape of the assist pattern when the contrast of the outermost pattern is less than 90% of the contrast of the cell array pattern, and repeatedly performing, after the comparison of the contrast of the outermost pattern, the determination of the shape of the assist pattern.

The resetting of the shape of the assist pattern may include changing a length or a dimension of the assist pattern, or changing a pattern type.

The change of the pattern type may include inserting a phase shift layer into the assist pattern.

The comparison of the contrast of the outermost pattern under a defocus state may include confirming whether or not the contrast of the outermost pattern is 70% or greater than that of the contrast of the cell array pattern under the defocus state. In this case, the value of 70% or more of the contrast of the main cell pattern is to assure that the distortion of the outermost pattern depends only on defocusing rather than on an optical proximity effect. This is based on a judgment in that a photo source used for realization of the outermost pattern is substantially free from an optical proximity effect and is under the same photo conditions as a photo source used for realization of the main cell pattern under a defocus state.

The comparison of the contrast of the outermost pattern under at the defocus state may be performed in a state in which a defocused range on the basis of a best focus is about one third of an entire focus margin. As a result, a required contrast of the outermost pattern is realized even in a defocus state as well as under the condition of a best focus. Whereby the optical proximity correction of the outermost pattern can be precisely accomplished.

The confirmation of whether or not the contrast of the outermost pattern is 70% or more than the contrast of the cell array pattern under the defocus state may include changing the assist pattern in consideration of overall factors when the contrast of the outermost pattern is less than 70% of the contrast of the cell array pattern under the defocus state.

After the change of the assist pattern in consideration of the overall factors, the method may further include recognizing a mask writing time in consideration of a length or a dimension of the assist pattern, or a pattern type, resetting the assist pattern after performing the recognizing step, determining the assist pattern after resetting the assist pattern, and repeatedly performing the comparison of the contrast of the outermost pattern.

The change of the assist pattern in consideration of the overall factors may include determining that optical proximity correction of the outermost pattern is completed when the contrast of the outermost pattern is 60% or more than the contrast of the cell array pattern under the defocus state under the assumption that a mask writing time is reduced in consideration of the length or the dimension of the assist pattern, or the pattern type.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

According to the present invention, to allow assist patterns, provided for the purpose of processing optical proximity correction, to have an optimum effect on an outermost pattern, e.g., optimal shapes and lengths of the assist patterns are set based on a flow chart according to the present invention, whereby optical proximity correction can be precisely accomplished.

Figure 1:
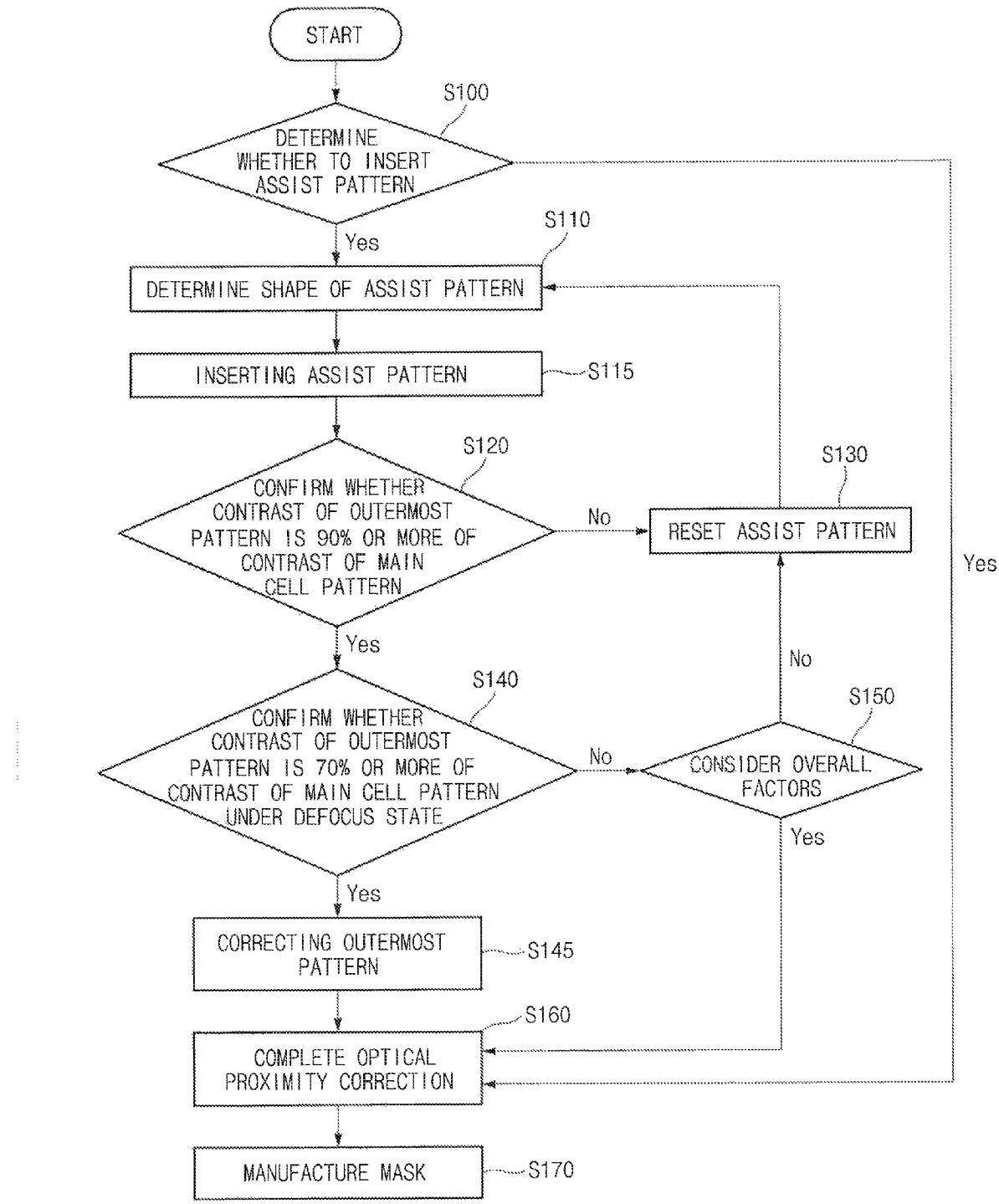
FIG. 1 is a flow chart illustrating an assist pattern insertion method for processing optical proximity correction according to the present invention.

FIG. 1 is a flow chart illustrating an assist pattern insertion method for processing optical proximity correction according to one embodiment of the present invention.

As shown in FIG. 1, it is determined whether or not to insert assist patterns in consideration of a position and a shape of an outermost pattern (S100). Here, when insertion of the assist patterns is unnecessary, it is determined that optical proximity correction of the outermost pattern is completed.

Figure 2:
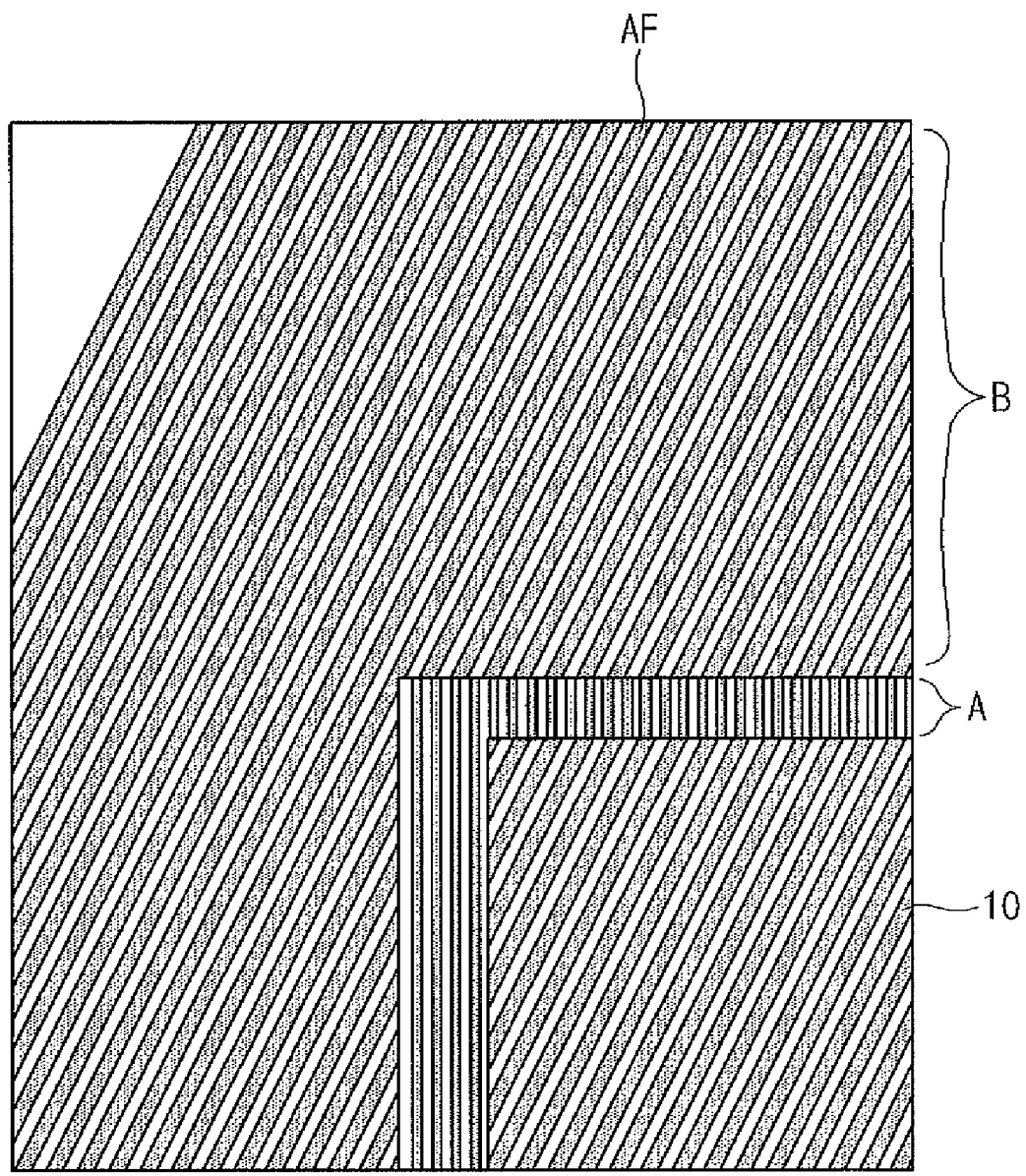
FIGS. 2 to 4 are plan views illustrating assist patterns provided in a peripheral region around a cell region according to an embodiment of the present invention.
Figure 3:
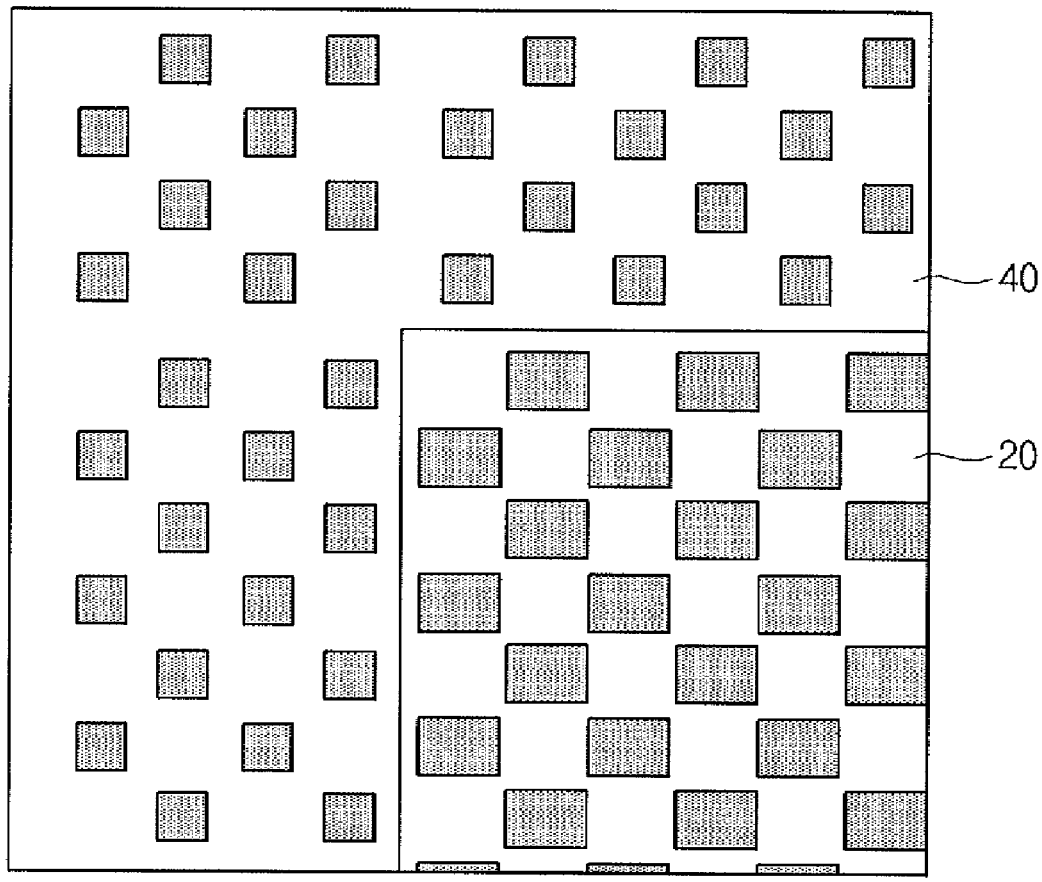
Figure 4:
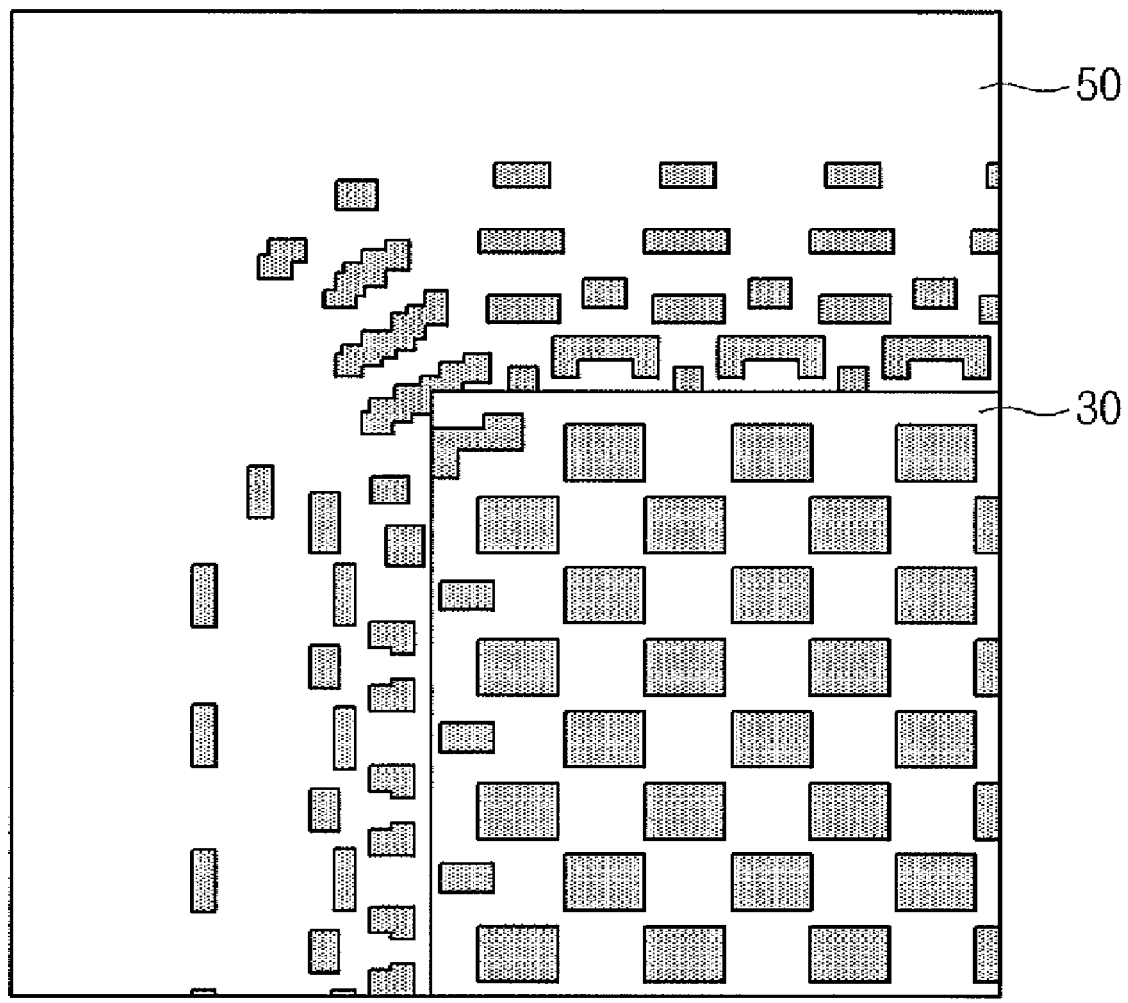

Next, shapes of the assist patterns to be inserted are determined (S110). The shapes of the assist patterns may be changed according to the shape of the outermost pattern. In an embodiment, the assist patterns may have shapes as shown in FIGS. 2 to 4. Of course, the exemplary shapes of the assist patterns are not limited to the those exemplary embodiments as depicted in FIGS. 2 to 4, and any number of different other shapes may be employed.

As shown in FIG. 2, the assist patterns AF take the form of line and space patterns. The assist pattern AF in an 'A' region and the assist pattern AF in a 'B' region have different lengths and shapes. To positively reduce an optical proximity effect of the outermost pattern in a cell array region 10, the assist pattern AF provided in the 'A' region adjacent to the outermost pattern has a shorter length, and the assist pattern AF provided in the 'B' region adjacent to the 'A' region has a longer length. In addition, as shown in FIGS. 3 and 4, the assist patterns AF provided in peripheral regions 40 and 50 around cell array regions 20 and 30 take the form of hole type patterns. Of course, the hole type assist patterns may be realized in various other shapes according to the shape of the outermost pattern of the cell array regions 20 and 30.

Next, it is confirmed whether a contrast of the outermost pattern is 90% or more of a contrast of a main cell pattern (S120). In this case, the contrast of the main cell pattern is preferably set on the basis of a best focus. In this operation S120, it can be confirmed whether the outermost pattern can be formed without serious distortion as compared to the main cell pattern. If the contrast of the outermost pattern has a value of 90% or more of the contrast of the main cell pattern, it is judged that the outermost pattern has no serious distortion and thus, the method proceeds to a following operation (S140). On the other hand, if the contrast of the outermost pattern is found to be less than 90% of the contrast of the main cell pattern, it is then determined that the outermost pattern is not patterned like the main cell pattern and is distorted. In this case, the reason behind limiting to a value of 90% or more of the contrast of the main cell pattern is to assure that the outermost pattern can be realized without serious distortion as compared to the main cell pattern based on a judgment in that a strength of a photo source used for realization of the outermost pattern is substantially free from an optical proximity effect and is equal to a strength of a photo source used for realization of the main cell pattern.

By comparing the contrast of the outermost pattern with the contrast of the main cell pattern as described above, there is possible to realize an efficient reduction process costs and time, as well as, minimize inaccuracies caused when the shapes or positions of the assist patterns are estimated via engineering or process know-how.

When the contrast of the outermost pattern is less than 90% of the contrast of the main cell pattern, the method proceeds to an operation of resetting the shapes of the assist patterns (S130). In the operation S130 of resetting the shapes of the assist patterns, lengths or dimensions of the assist patterns are changed, or a pattern type may be changed. The process of changing the pattern type may include, e.g., providing the assist patterns with a high light transmissivity, or inserting a phase shift layer. Preferably, this operation is repeatedly performed until the contrast of the outermost pattern reaches up to or greater than 90% of the contrast of the main cell pattern.

Next, when the contrast of the outermost pattern reached a value of 90% or more of the contrast of the main cell pattern, it is then confirmed whether the contrast of the outermost pattern greater than or equal to 70% of the contrast of the main cell pattern under a defocus state (S140). Here, the reason behind restriction the value to 70% or more of the contrast of the main cell pattern is to assure that the distortion of the outermost pattern depends only on defocusing rather than on an optical proximity effect. This is based on the assumption that a photo source used for realization of the outermost pattern is substantially free from an optical proximity effect and is under the same condition as a photo source used for realization of the main cell pattern under a defocus state.

In this case, a defocus margin is preferably one third of an entire focus margin. Specifically, it is confirmed whether a defocused range on the basis of a best focus is one third of an entire focus margin. Of course, the defocus margin is not essentially one third of an entire focus margin and is changeable. In conclusion, a required contrast of the outermost pattern is realized even in a defocus state as well as under the condition of a best focus, whereby optical proximity correction of the outermost pattern can be precisely accomplished.

If the contrast of the outermost pattern is found to be 70% or more of the contrast of the main cell pattern, it is determined that optical proximity correction of the outermost pattern is completed (S145) and thus, the method proceeds to the following operation (S160). On the other hand, if the contrast of the outermost pattern found to be less than 70% of the contrast of the main cell pattern, the method then proceeds to an assist pattern changing operation in consideration of overall factors (S150). Here, the overall factors include lengths and dimensions of the assist patterns, pattern types, or other factors required when writing the assist patterns on a mask. Specifically, when it is attempted to realize a smaller outermost pattern than the main cell pattern, realizing the outermost pattern may be practically impossible, or realizing the outermost pattern may be excessively larger than the main pattern, which can cause a considerable increase in writing time. For this reason, it is preferable to change the assist patterns in consideration of the above mentioned factors.

For example, if the contrast of the outermost pattern is less than 70% of the contrast of the main cell pattern despite the use of a first group of assist patterns and a second group of assist patterns, the first group of assist patterns and the second group of assist patterns should be changed in consideration of the above mentioned overall factors. In this case, it is preferable to select assist patterns having a relatively less complex arrangement by comparing the first group of assist patterns with the second group of assist patterns. That is, assist patterns having an arrangement suitable not to increase a writing time are selected. In conclusion, it is preferable to provide assist patterns having a relatively simplified arrangement, so as to reduce a writing time.

Here, even if the contrast of the outermost pattern is found to be not less than 70% of the contrast of the main cell pattern under a defocus state, it may be preferably determined that optical proximity correction of the outermost pattern is completed (S145), so long as the contrast of the outermost pattern is at least 60% or more of the contrast of the main cell pattern and the outermost pattern is shaped to minimize a mask writing time while not being realized on an actual wafer in consideration of the overall factors, i.e., in consideration of the lengths and dimensions of the assist patterns or pattern types.

Next, when the contrast of the outermost pattern is found to be 70% or more of the contrast of the main cell pattern under a defocus state, or when the contrast of the outermost pattern is found to be at least 60% or more of the contrast of the main cell pattern under a defocus state and the outermost pattern is shaped to reduce a mask writing time while not being realized on an actual wafer in consideration of the lengths and dimensions of the assist patterns or pattern types, it is then determined that standardization of the assist patterns is completed (S160). Here, the reason behind limiting to a value of 60% or more of the contrast of the main cell pattern is to assure that distortion of the outermost pattern depends only on defocusing rather than on an optical proximity effect based on the assumption that a photo source used for realization of the outermost pattern is substantially free from an optical proximity effect and is under the same photo conditions as a photo source used for realization of the main cell pattern under a defocus state. In addition, since it is judged that the assist patterns have optimal shapes so as to be substantially free from an optical proximity effect, it is judged that the outermost pattern can be relatively precisely realized even if the contrast of the outermost pattern is at most 60% or more of the contrast of the main cell pattern. Completion of the standardization of the assist patterns denotes that optical proximity correction of the outermost pattern is precisely completed (S145).

Standardizing the assist patterns via the above described operations has the effects of reducing processing time and costs required for optical proximity correction of the outermost pattern, which results in more efficient optical proximity correction (S145).

As is apparent from the above description, the method for processing optical proximity correction according to the embodiment of the present invention adopts standardization of assist patterns to be inserted for the purpose of optical proximity correction rather than repeatedly performing experiments. Thereby implementing the present invention can realize a considerable reduction in the processing time as opposed to trial and error. Furthermore, with relation to insertion of the assist patterns, optimal insertion of the assist patterns can be accomplished by applying different conditions to specific layers.

The above embodiments of the present invention are illustrative and not limitative. Any number of alternate variations and equivalents are possible and within the scope of the present invention. Further, the present invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for processing optical proximity correction of a mask, the method comprising:
   determining whether or not to insert an assist pattern around an outermost pattern;
   determining a shape of the assist pattern inserted around the outermost pattern;
   inserting the assist pattern around the outermost pattern;
   comparing a contrast of the outermost pattern with a contrast of a cell array pattern; and
   repeatedly comparing a contrast of the outermost pattern with a contrast of the cell array pattern under a defocus state;
   correcting the outermost pattern;
   completing the optical proximity correction of the outermost pattern; and
   manufacturing the mask.

2. The method according to claim 1, wherein the determination of whether to insert the assist pattern includes determining if optical proximity correction of the outermost pattern is completed when insertion of the assist pattern is unnecessary.

3. The method according to claim 1, wherein the determination of the shape of the assist pattern inserted around the outermost pattern is differently accomplished in accordance to a shape of the outermost pattern.

4. The method according to claim 1, wherein the comparison of the contrast of the outermost pattern includes confirming whether or not the contrast of the outermost pattern is 90% or greater than the contrast of the cell array pattern.

5. The method according to claim 1, wherein the comparison of the contrast of the outermost pattern includes determining the contrast of the outermost pattern under a best focus condition.

6. The method according to claim 4, further comprising:
   resetting, after the comparison of the contrast of the outermost pattern, the shape of the assist pattern when the contrast of the outermost pattern is less than 90% of the contrast of the cell array pattern; and
   repeatedly performing, after the comparison of the contrast of the outermost pattern, the determination of the shape of the assist pattern.

7. The method according to claim 6, wherein the resetting of the shape of the assist pattern includes changing a length or a dimension of the assist pattern, or changing a pattern type.

8. The method according to claim 7, wherein the change of the pattern type includes inserting a phase shift layer into the assist pattern.

9. The method according to claim 1, wherein the comparison of the contrast of the outermost pattern under a defocus state includes confirming whether or not the contrast of the outermost pattern is 70% or greater than the contrast of the cell array pattern at the defocus state.

10. The method according to claim 1, wherein the comparison of the contrast of the outermost pattern at the defocus state is performed in a state in which a defocused range on the basis of a best focus is about one third of an entire focus margin.

11. The method according to claim 9, wherein the confirmation of whether or not the contrast of the outermost pattern is 70% or more than the contrast of the cell array pattern under the defocus state includes changing the assist pattern in consideration of overall factors when the contrast of the outermost pattern is less than 70% of the contrast of the cell array pattern under the defocus state.

12. The method according to claim 11, further comprising:
   recognizing, after the change of the assist pattern in consideration of the overall factors, a mask writing time in consideration of a length or a dimension of the assist pattern, or a pattern type;
   resetting the assist pattern after performing the recognizing step;
   determining the assist pattern after performing the resetting step; and
   repeatedly performing the comparison of the contrast of the outermost pattern.

13. The method according to claim 11, wherein the change of the assist pattern in consideration of the overall factors includes determining that optical proximity correction of the outermost pattern is completed when the contrast of the outermost pattern is 60% or more than the contrast of the cell array pattern under the defocus state under the assumption that a mask writing time is reduced in consideration of the length or the dimension of the assist pattern, or the pattern type.

* * * * *